(12) United States Patent
Saen et al.

(10) Patent No.: US 7,899,643 B2
(45) Date of Patent: Mar. 1, 2011

(54) SEMICONDUCTOR INTEGRATED CIRCUIT DEVICE (75) Inventors: Makoto Saen, Kodaira (JP); Kenichi Osada, Tokyo (JP); Tetsuya Yamada, Sagamihara (JP); Yusuke Kanno, Kodaira (JP); Satoshi Misaka, Kokubunji (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 231 days.

(21) Appl. No.: 11/935,790

(22) Filed: Nov. 6, 2007

(65) Prior Publication Data

US 2008/0114967 A1 May 15, 2008

(30) Foreign Application Priority Data

Nov. 9, 2006 (JP) .............................. 2006-303873

(51) Int. Cl.
  *G01K 1/12* (2006.01)
  *G06F 19/00* (2006.01)

(52) U.S. Cl. ...................................... 702/132

(58) Field of Classification Search ................ 702/132, 702/130, 60, 64, 65, 99, 117; 374/100; 700/299; 327/83, 262, 513
See application file for complete search history.

(56) References Cited

U.S. PATENT DOCUMENTS

| 5,963,079 | A * | 10/1999 | Hoang ......................... 327/512 |
| 7,180,211 | B2 * | 2/2007 | Sinha et al. ................. 307/651 |
| 7,216,064 | B1 * | 5/2007 | Pippin .......................... 703/1 |
| 7,427,158 | B2 * | 9/2008 | Yoshida ....................... 374/172 |
| 7,434,985 | B2 * | 10/2008 | Hsu et al. ..................... 374/1 |
| 2003/0212474 | A1 * | 11/2003 | Pippin ........................ 700/300 |
| 2004/0047099 | A1 * | 3/2004 | Pippin ........................ 361/103 |
| 2005/0071116 | A1 * | 3/2005 | Kim ............................ 702/132 |
| 2006/0012930 | A1 * | 1/2006 | Oh et al. ..................... 361/91.6 |
| 2006/0129881 | A1 | 6/2006 | Furuichi et al. |
| 2006/0161375 | A1 * | 7/2006 | Duberstein et al. .......... 702/132 |
| 2007/0106428 | A1 * | 5/2007 | Omizo et al. ............... 700/300 |
| 2007/0140030 | A1 * | 6/2007 | Wyatt ........................ 365/212 |
| 2008/0022140 | A1 * | 1/2008 | Yamada et al. .............. 713/322 |
| 2008/0039981 | A1 * | 2/2008 | Wyatt et al. ................ 700/299 |
| 2008/0091378 | A1 * | 4/2008 | Jeong et al. ................. 702/130 |

FOREIGN PATENT DOCUMENTS

| EP | 1 615 134 A2 | 1/2006 |
| JP | 2006-018758 A | 1/2006 |
| JP | 2006-146605 A | 6/2006 |

* cited by examiner

*Primary Examiner*—Cindy Hien-Dieu Khuu
(74) *Attorney, Agent, or Firm*—Miles & Stockbridge P.C.

(57) ABSTRACT

A semiconductor integrated circuit device which consumes less power and enables real-time processing. The semiconductor integrated circuit device includes thermal sensors which detect temperature and determine whether the detection result exceeds reference values and output the result, and a control block capable of controlling the operations of arithmetic blocks based on the output signals of the thermal sensors. The control block returns to an operation state from a suspended state with an interrupt signal based on the output signals of the thermal sensors and determines the operation conditions of the arithmetic blocks to ensure that the temperature conditions of the arithmetic blocks are satisfied. Thereby, power consumption is reduced and real-time processing efficiency is improved.

7 Claims, 7 Drawing Sheets

SEMICONDUCTOR INTEGRATED CIRCUIT DEVICE

CLAIM OF PRIORITY

The Present application claims priority from Japanese application JP 2006-303873 filed on Nov. 9, 2006, the content of which is hereby incorporated by reference into this application.

FIELD OF THE INVENTION

The present invention relates to a semiconductor integrated circuit technology and, specifically, to a semiconductor integrated circuit device in which operation temperature is taken into consideration.

BACKGROUND OF THE INVENTION

Along with a reduction in line width in the semiconductor production process, the integration degree of LSI's is improving and a plurality of systems can be integrated over one chip. However, this reduction in line width increases power. This power increase is due to the scaling down of power voltage and an increase in leakage current. How to avoid thermorunnaway caused by a power increase is important for an LSI to be incorporated.

As means of avoiding the thermorunnaway caused by a power increase, it is conceivable that thermal sensors are integrated in an LSI and power is controlled based on the values of the thermal sensors.

Patent Document 1 discloses a technology for suspending the operation of a processor for a certain period of time when the temperature of the processor exceeds a certain point. Patent Document 2 discloses a technology for shifting processing to another processor when the operation temperature of one of processors contained in an LSI exceeds a certain point.

[Patent document 1] Japanese Laid-open Patent Application No. 2006-146605

[Patent document 2] Japanese Laid-open Patent Application No. 2006-018758

SUMMARY OF THE INVENTION

Along with an increase in power due to the enhanced performance of a built-in device, a heat problem will become important even in the built-in device in the future. However, for the application of built-in devices, there are restriction conditions different from those of the server field, such as strict cost requirements and use in various environments. For example, it is considered that the following requirements must be satisfied for the application of built-in devices.

(1) Built-in devices should consume less power and be mounted in a small area.

(2) They should be made operable even when the ambient temperature varies by a change in use environment.

(3) They should enable real-time processing having a time limit.

However, in the above patent document 1, the operation of the processor is suspended for a certain period of time and the acceptance of real-time processing during this period is not taken into consideration. Both the above patent document 1 and patent document 2 are silent about the conditions of the above requirement (2).

It is an object of the present invention to provide a semiconductor integrated circuit device which consumes less power and enables real-time processing.

It is another object of the present invention to provide a semiconductor integrated circuit device in which a change in ambient temperature caused by a change in use environment is taken into consideration.

The above and other objects and novel feature of the present invention will become apparent from the following description and the accompanying drawings.

A brief description of typical one of the inventions disclosed by the present application is given below.

That is, thermal sensors which can detect the temperature, compare the detection results with a plurality of reference values and output the results, and a control block which can control the operations of arithmetic blocks based on the output signals of the above thermal sensors are provided. The above control block comprises a peripheral circuit block for generating an interrupt signal based on the output signals of the above thermal sensors, and a controller which returns to an operation state from a suspended state with the input interrupt signal as a trigger and can determine the operation conditions of the arithmetic blocks to meet the temperature conditions of the above arithmetic blocks.

A brief description of an effect obtained by the typical one of the inventions disclosed by the present application is given below.

That is, a semiconductor integrated circuit device which consumes less power and enables real-time processing can be provided.

DETAILED DESCRIPTION OF THE PREFERRED EMBODIMENTS

1. Typical Embodiment

A typical embodiment of the invention disclosed by the present application will be first outlined hereinbelow. Reference symbols in the drawings referred to with parentheses in the brief description of the typical embodiment merely represent what are included in the concepts of the constituent elements designated by the reference symbols.

[1] The semiconductor integrated circuit device (SOC) according to a typical embodiment of the present invention comprises: arithmetic blocks (FB) for carrying out predetermined arithmetic processing; thermal sensors (TSNS) which have a plurality of different reference values, detect the temperature, determine whether the detection results exceed the above reference values or not thereby to output the results; and a control block (RM) which can control the operations of the above arithmetic blocks based on the output signals of the above thermal sensors. The above control block includes: a peripheral circuit block (RMP) for generating an interrupt signal based on the output signals of the above thermal sensors; and a controller (RMC) which returns to an operation state from a suspended state with the above input interrupt signal as a trigger and can determine the operation conditions of the above arithmetic blocks to ensure that the temperature conditions of the above arithmetic blocks are satisfied.

According to the above constitution, the temperature is detected, it is determined whether the detection result exceeds each of the above reference values or not, and the determination result is output, whereby a time temperature change is known and the changing ambient temperature of a built-in device can be computed, thereby making it possible to cope with temperature variations. Since the controller returns to an operation state from a suspended state with the input interrupt signal as a trigger, its operation can be suspended until it receives the interrupt signal, thereby making it possible to minimize power consumed by temperature control.

[2] Each of the above thermal sensors may include a thermal sensor block (TSNSB) for detecting the temperature and a plurality of comparators (CMP) for comparing the temperature detection result of the above thermal sensor block with a plurality of different reference voltages.

[3] The above peripheral circuit block include an interrupt control circuit for generating a plurality of interrupt signals corresponding to output signals from the above comparators.

[4] The above peripheral circuit block may include a filter block (FLT) for integrating the output signals from the above comparators so that an output signal from the filter block can be transmitted to the above interrupt control circuit. The fluctuations and noise of a signal from the thermal sensor block can be removed by the above filter block.

[5] External terminals (TSCO, REFCO) capable of outputting the temperature detection result of the above thermal sensor to the outside of the above semiconductor integrated circuit device can be provided. Since the external monitoring of the above temperature sensor block TSNSB is thereby made possible, it is possible to check if temperature detection is carried out properly by the above temperature sensor block TSNSB and to improve reliability.

[6] The semiconductor integrated circuit device comprises a delay monitors which can monitor the amount of delay of a critical path in the above arithmetic blocks and the above interrupt control circuit generates interrupt signals corresponding to output signals from the delay monitors, besides a plurality of interrupt signals corresponding to output signals from the comparators, and outputs them to the above controller.

[7] The above controller can control the operations of the above arithmetic blocks to exhibit the maximum performance while it satisfies the temperature conditions of the above arithmetic blocks.

[8] The above controller includes first processing (401) for computing the component of heat derived from the ambient temperature and leakage current and second processing (402) for computing the permissible maximum operation power from the computation result obtained in the above first processing so that power permitted in the above arithmetic blocks is determined based on the computation result of the above second processing.

[9] The semiconductor integrated circuit device comprises: arithmetic blocks for carrying out predetermined arithmetic processing; thermal sensors which have a plurality of different reference values, can detect temperature, determine whether the detection results exceed the reference values and output the result; delay monitors capable of monitoring the amount of delay of the critical path in the above arithmetic blocks; an operation voltage monitor capable of monitoring the operation voltages of the above arithmetic blocks; and a control block capable of controlling the operations of the above arithmetic blocks based on the output signals of the above thermal sensors, the monitoring results of the above delay monitors and the monitoring result of the above operation voltage monitor, wherein the above control block includes: a peripheral circuit block which generates an interrupt signal based on the output signals of the above thermal sensors, the monitoring results of the above delay monitors and the monitoring result of the above operation voltage monitor; a controller (RMP) which returns to an operation state from a suspended state with the input interrupt signal as a trigger and determines the operation conditions of the above arithmetic blocks to ensure that the temperature conditions of the above arithmetic blocks are satisfied; and an operation condition control circuit (RMC) which can instruct an operation frequency for the above arithmetic blocks, the cut-off of power voltage in the above arithmetic blocks and the control of body bias based on the operation condition determined by the above controller.

[10] A semiconductor integrated circuit device comprises a plurality of semiconductor chips sealed in one package, at least one of the above semiconductor chips is one of the semiconductor integrated circuit devices [1] to [9], and the above controller included in the device can determine the operation condition of each chip so that the temperature condition of each of the semiconductor chips is satisfied.

2. Description of the Embodiment

The Embodiment will be further detailed hereinunder.

Figure 1:
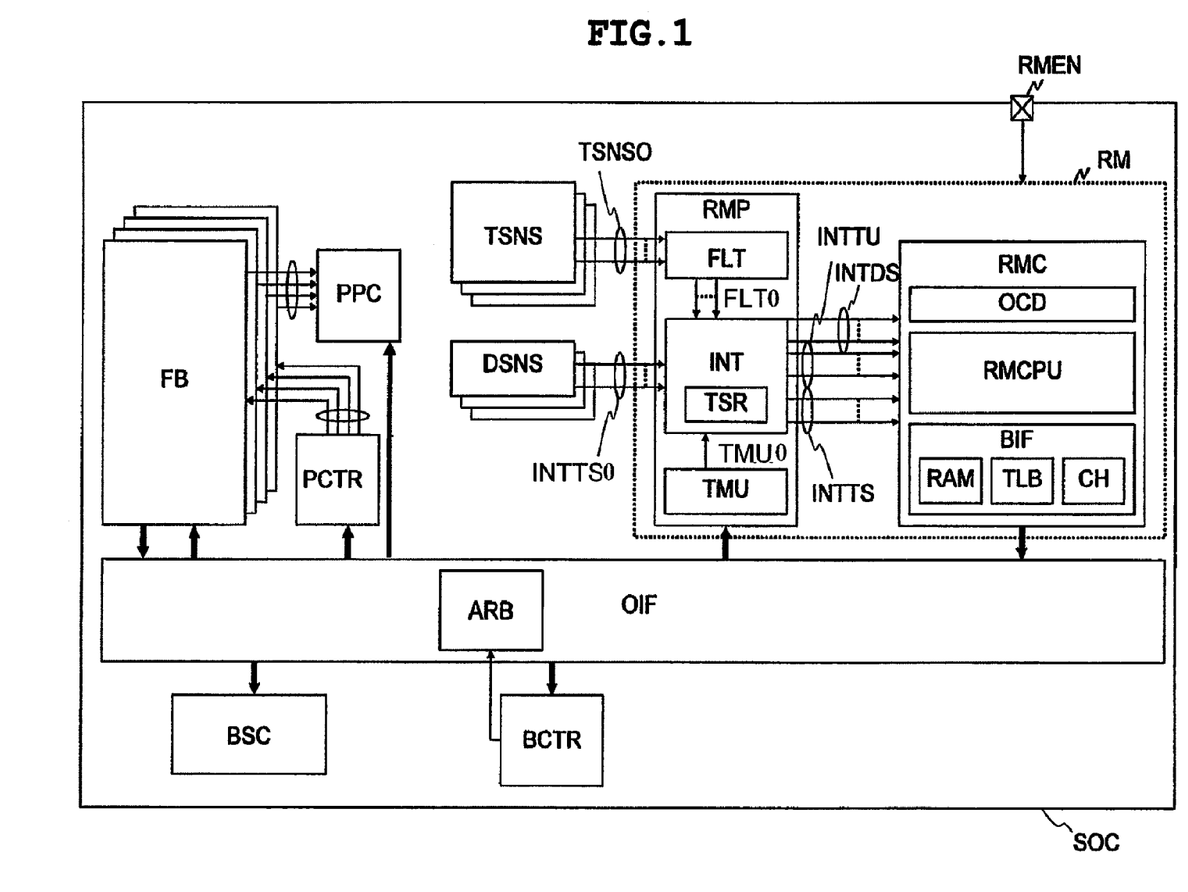
FIG. 1 is a block diagram of a system-on-chip as an example of the semiconductor integrated circuit device of the present invention.

FIG. 1 shows a system-on-chip which is an example of the semiconductor integrated circuit device of the present invention.

The system-on-chip SOC shown in FIG. 1 which is not particularly limited is formed on one semiconductor substrate such as a single crystal silicon substrate by a known semiconductor integrated circuit manufacturing technology, and a large number of arithmetic blocks FB are integrated on one chip.

The system-on-chip SOC shown in FIG. 1 comprises thermal sensors TSNS, delay monitors DSNS, a control block RM for controlling the system-on-chip SOC based on a control signal RMEN given through an external terminal, arithmetic blocks FB for carrying out user processing, a monitoring circuit PPC for monitoring the processing execution states of the arithmetic blocks FB, a memory interface control circuit BSC, an operation frequency control circuit PCTR for setting the operation frequency of each block, an on-chip interface OIF for connecting these blocks, and a block BCTR for controlling the arbitration of the on-chip interface. The control block RM for controlling the system-on-chip SOC is composed of a controller RMC and a peripheral circuit block RMP coupled to the controller RMC. The controller RMC includes a controller RMCPU for executing a control program, an interface block BIF including a local memory RAM, an address conversion table TLB and a cache CH, and an on-chip debug circuit OCD. The peripheral circuit block RMP coupled to the controller RMC includes a block FLT for filtering information from the thermal sensors TSNS, a timer block TMU, and an interrupt control block INT for transmitting information from the thermal sensors TSNS and the timer block TMU to the controller RMC. As means by which the interrupt control block INT transmits the information from the thermal sensors TSNS to the controller RMC is the means of using an interrupt INTTS signal or the means of reading a register TSR in INTTS from the controller RMS. The monitoring circuit PPC is the means of monitoring the state of executing processing, and an example of the "state of executing processing" is the number of instructions executed. The delay monitors DSNS are blocks for detecting whether the propagation delay of the critical path is in violation of delay. The delay of a transistor has dependence upon temperature and chip, and it is necessary to determine the operation speeds of the arithmetic blocks FB in view of not only temperature but also this delay. The delay monitors DSNS have the same or slightly larger delay than that of the critical path and when the propagation delay becomes larger than an expected value and delay violation occurs, they assert that INTTSO should be set to a logical value "1".

In this constitution, RM computes the suitable operation conditions such as operation frequencies of the arithmetic blocks FB using the inside temperature information of the system-on-chip SOC, delay information, information on the operation states of the arithmetic blocks FB and information on operation frequency measured by the thermal sensors TSNS, the delay monitors DSNS and the monitoring circuit PPC, and feeds back the result to the arithmetic blocks FB.

Figure 2:
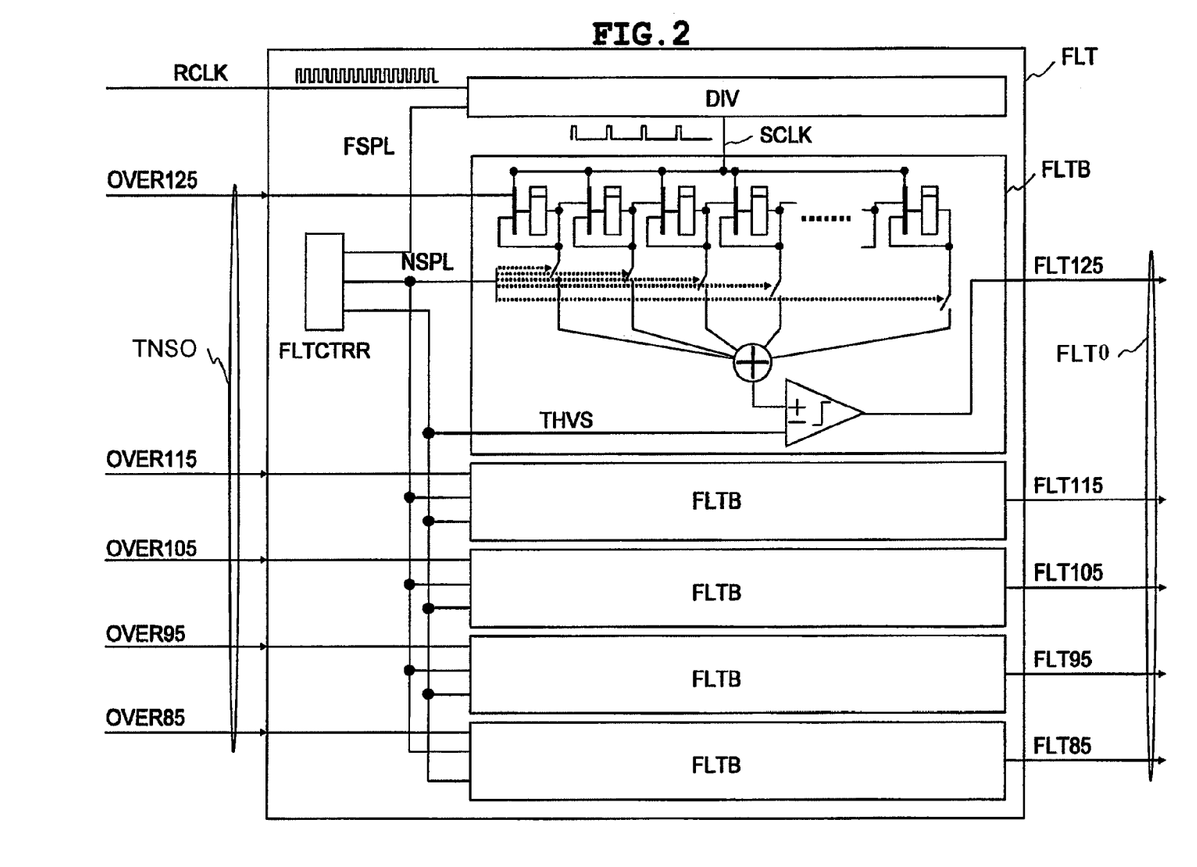
FIG. 2 is a block diagram of the main section of the above system-on-chip.

FIG. 2 shows an example of the filter block FLT in FIG. 1.

The filter block FLT is an integration type filter for removing the fluctuations and noise of signals from the thermal sensors TSNS. This filter block FLT eliminates the need for the controller RMC's processing of removing fluctuations and noise with software, thereby making it possible to suppress the processing frequency and realize low power consumption. The filter block FLT comprises a block DIV for dividing a standard clock RCLK and generating a sampling clock SCLK, and blocks FLTB for sampling input signals TSNSO from the sensors in synchronism with the sampling clock and filtering them. The blocks FLTB integrate the sampled signals, compare the integrated value with a set value THVS and output the comparison result. The number of the blocks FLTB depends on the number of input signals from the sensors. The filter block FLT can be changed by writing the number of samplings NSPL and the sampling frequency FSPL to a control register.

Figure 3:
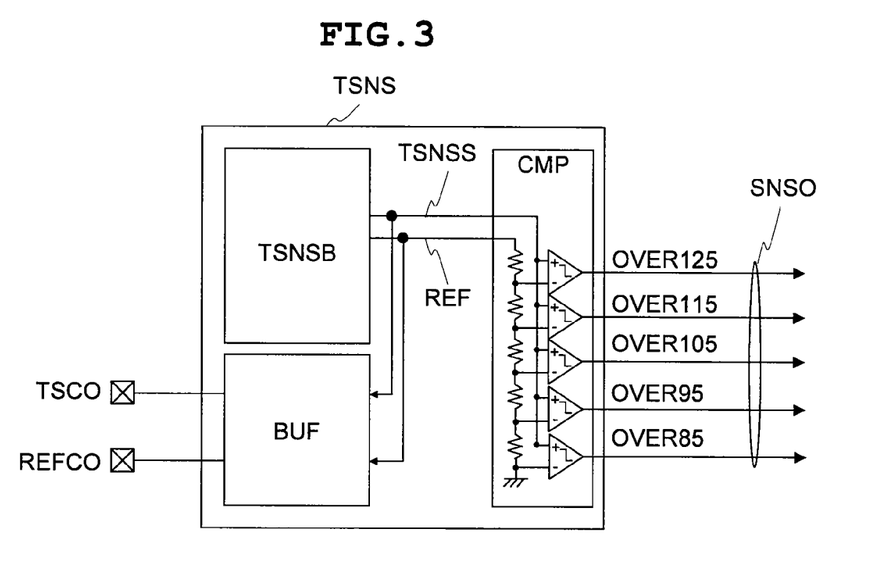
FIG. 3 is a block diagram of the main section of the above system-on-chip.

FIG. 3 shows an example of the above thermal sensor TSNS.

The above thermal sensor TSNS includes a thermal sensor block TSNSB for measuring a band gap voltage, a buffer block BUF for outputting the output voltage TSNSS of the thermal sensor block and a reference voltage REF to the outside of the chip, and a plurality of comparators CMP for detecting that the above output voltage TSNSS is higher than a specific level. Each comparator compares the above output voltage TSNSS with different standard voltages obtained by dividing the reference voltage REF by a plurality of resistances. The standard voltages obtained by dividing the reference voltage by the resistances are set by the relationship with temperature detected by the thermal sensor TSNS. For example, an "OVER125" signal included in the output signal SNSO of the thermal sensor TSNS outputs a logic value "1" while the temperature detected by TSNSB exceeds 125° C. An "OVER115" signal included in the output signal SNSO of the thermal sensor TSNS outputs a logic value "1" while the temperature detected by TSNSB exceeds 115° C. Similarly, other signals included in SNSO detect other different temperatures. In this embodiment, the ambient temperature outside the LSI is estimated by using a plurality of temperature information (OVER125, OVER115, OVER105, OVER95 and OVER85) which are output from the above comparators, thereby carrying out more accurate control.

The above thermal sensor block TSNSB can output data to the outside of the chip through the buffer BUF and the external terminal TSCO of the chip. The above reference voltage REF can be output to the outside of the chip through the buffer BUF and the external terminal REFCO of the chip. Thereby, the external monitoring of the above thermal sensor block TSNSB is made possible, and it can be checked by the above thermal sensor block TSNSB whether temperature detection is carried out properly or not.

Figure 4:
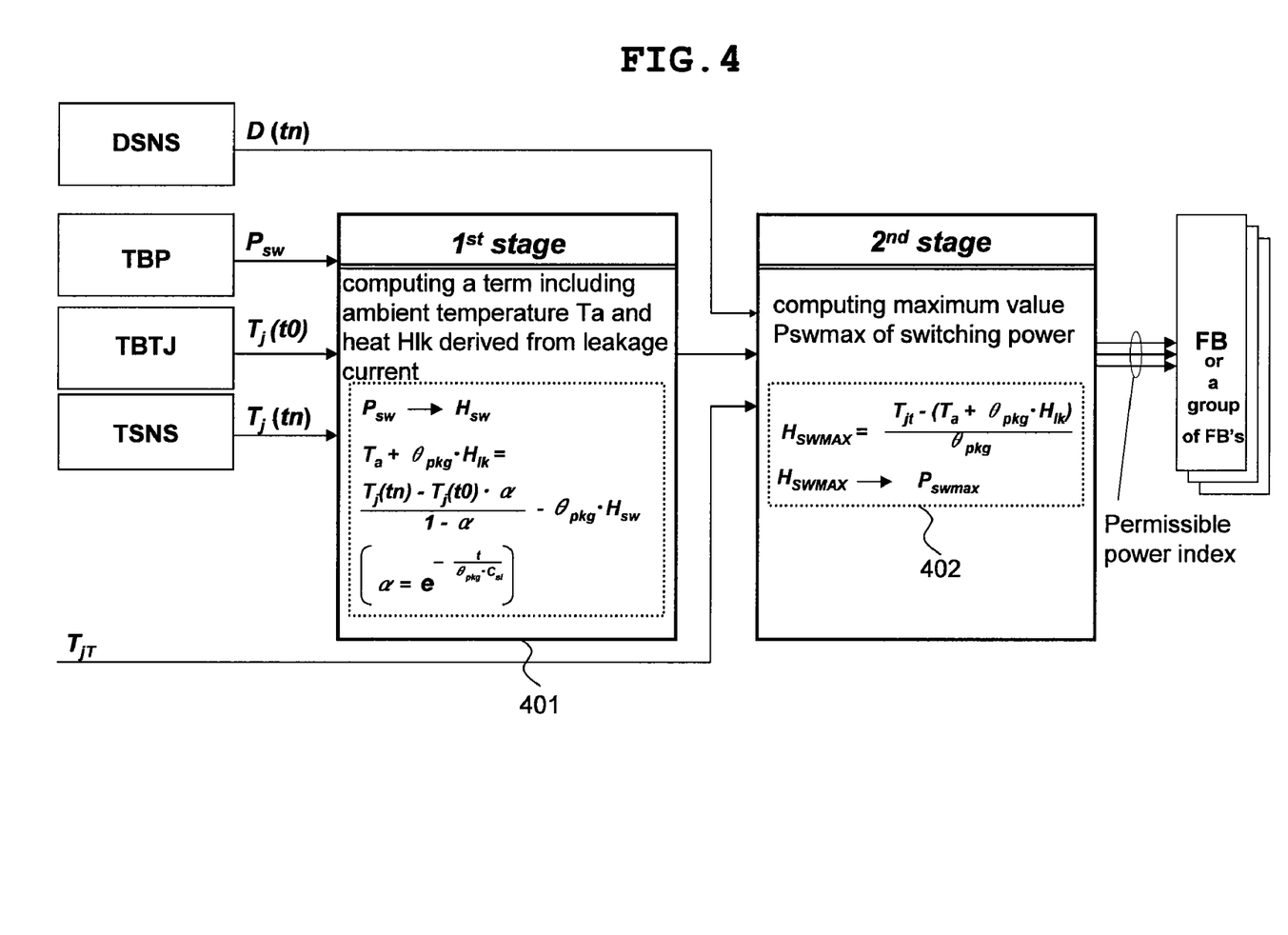
FIG. 4 is a diagram for explaining arithmetic processing which is carried out by the main section of the above system-on-chip.

FIG. 4 shows a temperature control flow.

The controller RMC controls arithmetic processing and the operation of a predetermined block based on the flow shown in FIG. 4. In FIG. 4, Tj is the operation temperature of the system-on-chip SOC measured by the thermal sensors TSNS, TBP is a table for keeping past control voltage values, TBTJ is a table for keeping the past temperature information of the system-on-chip SOC, Tjt is a control target temperature, and Psw is the switching power of the power component of the system-on-chip SOC. Plk is the leakage power of the power component of the system-on-chip SOC, Hsw is heat generated by Psw, and Hlk is heat generated by the leakage current Plk of the system-on-chip SOC. Ta is the ambient temperature, $\theta_{pkg}$ is the thermal resistance of the package, $C_{st}$ is the thermal capacitance of LSI, $H_{swmax}$ is heat generated by a permissible switching power, and $P_{swmax}$ is the permissible switching power. The purpose of this temperature control is to develop the maximum performance at a temperature lower than the limit temperature specified for the system-on-chip SOC. In general temperature control, the operation of the circuit is suspended right before the limit temperature is reached, or the frequency is reduced to a predetermined value. However, the suspension of the operation of the circuit or a great reduction in frequency has an influence upon the operation of the important real-time processing of a built-in system. In the system-on-chip SOC to be incorporated, the ambient temperature Ta greatly changes and the frequency to be reduced changes according to Ta. This makes difficult the control of a device to be incorporated. In this embodiment, the term including the changing ambient temperature Ta and the component of heat Hlk derived from the leakage current is calculated by arithmetic processing represented by the equation 401 in the first stage. Since the leakage current also has temperature dependence, it is computed in the first stage. In this computation, a time change in the temperature Tj of the system-on-chip SOC and the previous switching power value Psw are used. To know this temperature change, a mechanism for detecting a plurality of temperature levels described in FIG. 3 is required.

In the next second stage, the permissible maximum operation power is computed by the arithmetic processing represented by the equation 402 using the computation result obtained in the first stage. In this second stage, delay information from the delay monitors DSNS is also added. To determine the distribution of the permissible power to each functional block in the whole system-on-chip SOC, a predetermined power distribution table is used. The controller RMC informs each functional block of a permissible power index. Examples of the power index include a power value and a frequency. Each functional block controls its own power based on the power index. This control is carried out when a plurality of determined temperature levels are detected and an interrupt occurs or when an interrupt from the timer is asserted. To distribute the permissible power to each functional block, power required for each function is informed to the controller RMC and distributed dynamically. The unit which the controller RMC informs of a power index is a functional block in the above embodiment but may be a group of functional blocks. A power index is informed to a functional block controlling the group of functional blocks. An example of the functional blocks is an area including a CPU, dedicated intellectual property and peripheral blocks.

Figure 5:
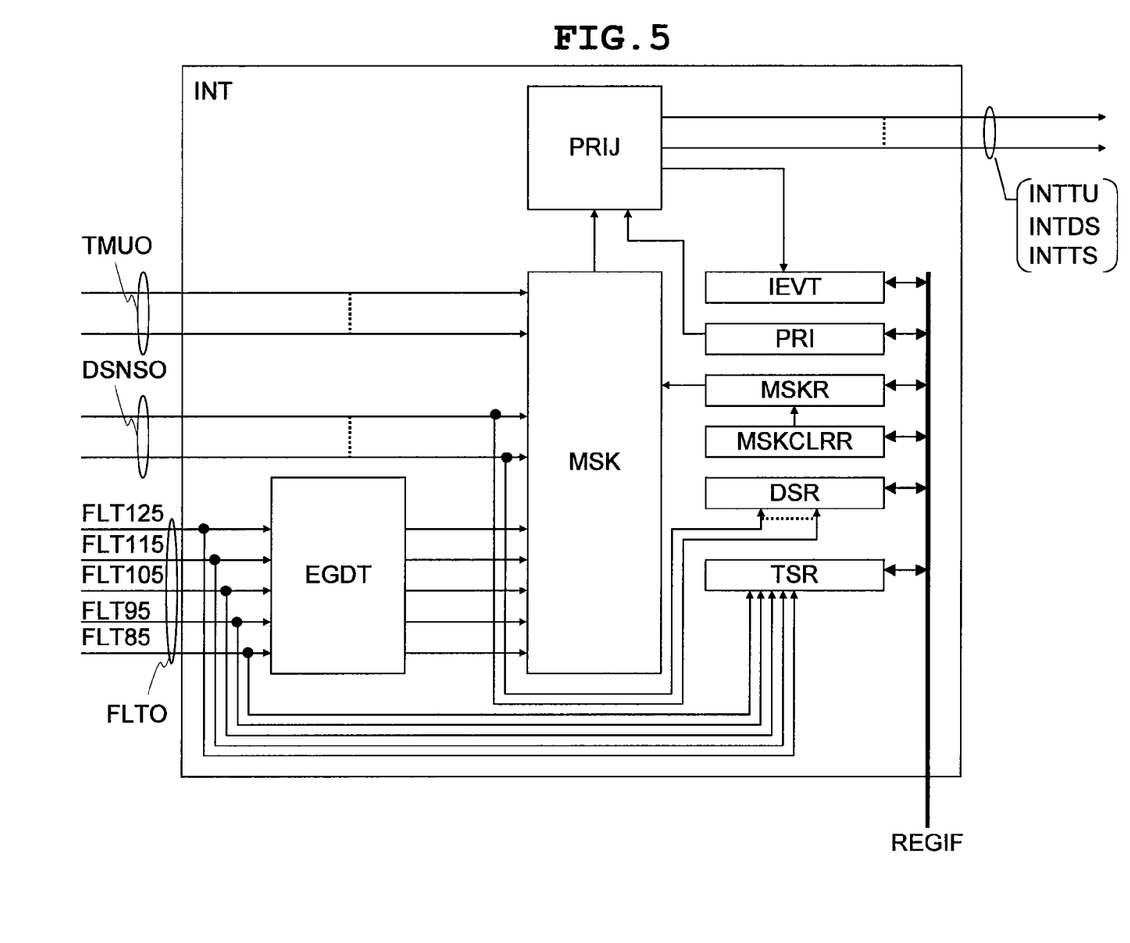
FIG. 5 is a block diagram of the main section of the above system-on-chip.

FIG. 5 shows an example of the interrupt control block INT.

The above interrupt control block INT receives an output signal TMU0 from the timer block TMU, an output signal FLT0 from the filter FLT and an output signal INTTS0 from a delay monitor DSNS and generates interrupt requests INTTU, INTDS and INTTS to the controller RMC. The above interrupt control block INT comprises an edge detection block EGDT for detecting the rising edge and falling edge of the FLT0 signal, a mask block MSK for cutting off a signal which does not reflect an interrupt request to the controller RMC out of the input signals, PRIJ which selects a factor having top priority from a plurality of factors passing through this mask block MSK as an interrupt request, and registers (IEVT, PRI, MSKR, MSKCLRR, TSR and DSR). IEVT is a register for keeping a factor of generating an interrupt request. PRI is a register for determining the priority of each factor. MSKR is a register for determining whether each factor is cut off, and MSKCLRR is a register for clearing the mask specification of each factor in MSKR. DSR is a register for keeping delay information from INTTS0, and TSR is a register for keeping temperature information from the thermal sensors TSNS. These registers can be read or written from the controller RMC through the interface. The mask block MSK cuts off a factor specified by MSKR. One of the features of the block INT is that the riding edge and the falling edge of information from the thermal sensors TSNS are detected by the edge detection block EGDT to generate an interrupt request. Thereby, it is possible to distinguish a temperature rise from a temperature drop, and operation control according to this is made possible.

According to the above embodiment, the following function and effect can be obtained.

Figure 8:
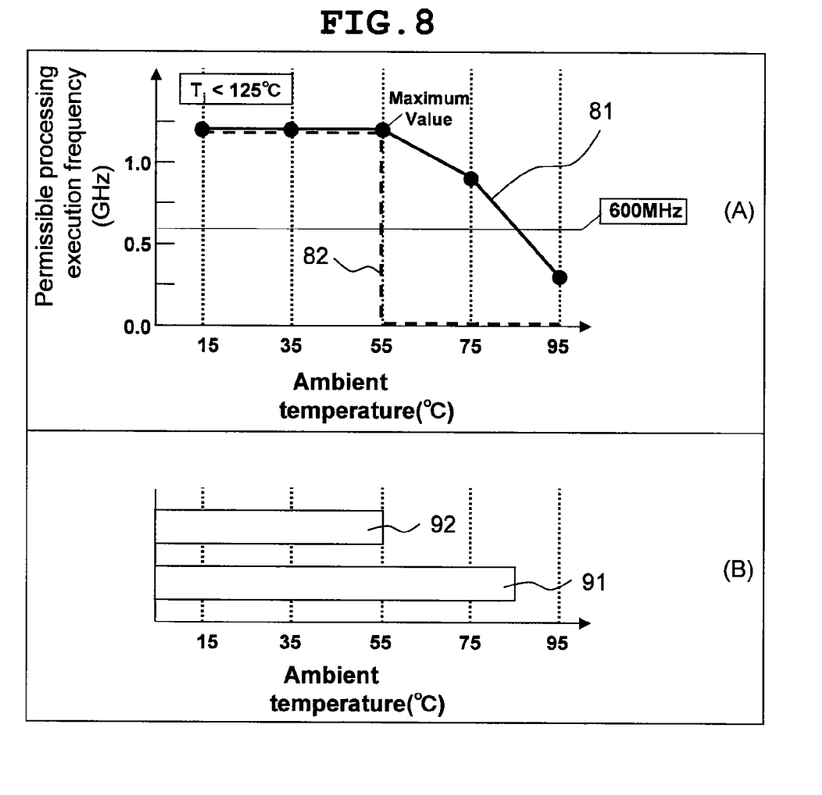
FIGS. 8(A) and 8(B) are characteristic diagrams showing that ambient temperature for guaranteeing the real-time operation of the above system-on-chip is expanded.

(1) It is possible to control the operation of a functional circuit so that its performance can be maximized while the operation of an LSI at its operation temperature range is ensured. Particularly, in the case of an LSI to be incorporated, the permissible performance of a functional circuit greatly changes according to variations in ambient temperature. According to the above embodiment, the operation of the functional circuit is controlled by taking the ambient temperature into consideration. One example of this effect is shown in FIGS. 8(A) and 8(B). The characteristic curve 82 which is compared in FIG. 8(A) shows characteristics when the operation of the functional circuit is suspended right before the operation limit temperature of the LSI is reached. In this comparative system, real-time processing is not accepted while the operation of the functional circuit is suspended, and the real-time processing is inhibited. In contrast to this, in the above embodiment, as shown in the characteristic curve 81, real-time processing is possible with the maximum performance even at any ambient temperature. For example, when the permissible processing execution frequency is 600 MHz, the ambient temperature range is 85° C. in the above embodiment whereas the ambient temperature range is 55° C. in the comparative system as shown in FIG. 8 (B). Thus, the ambient temperature at which the real-time operation can be guaranteed is expanded.

(2) In the above embodiment, the operation of the controller RMC can be suspended until an interrupt signal is asserted due to the structure that temperature information is informed to the controller RMC by an interrupt and the structure that an unrequired interrupt between the thermal sensors TSNS and RM is suppressed by the filter circuit. That is, the controller RMC is returned to an operation state from a suspended state with the interrupt signal as a trigger, thereby making it possible to minimize power required for temperature control.

(3) The thermal sensor block TSNSB can output to the outside of the chip through the buffer BUF and the external terminal TSCO of the chip, and the above reference voltage REF can be output to the outside of the chip through the buffer BUF and the external terminal REFCO of the chip. Therefore, the external monitoring of the above thermal sensor block TSNSB is possible. Thereby, the above thermal sensor block TSNSB can check if temperature detection is carried out properly, thereby making it possible to improve reliability.

Figure 6:
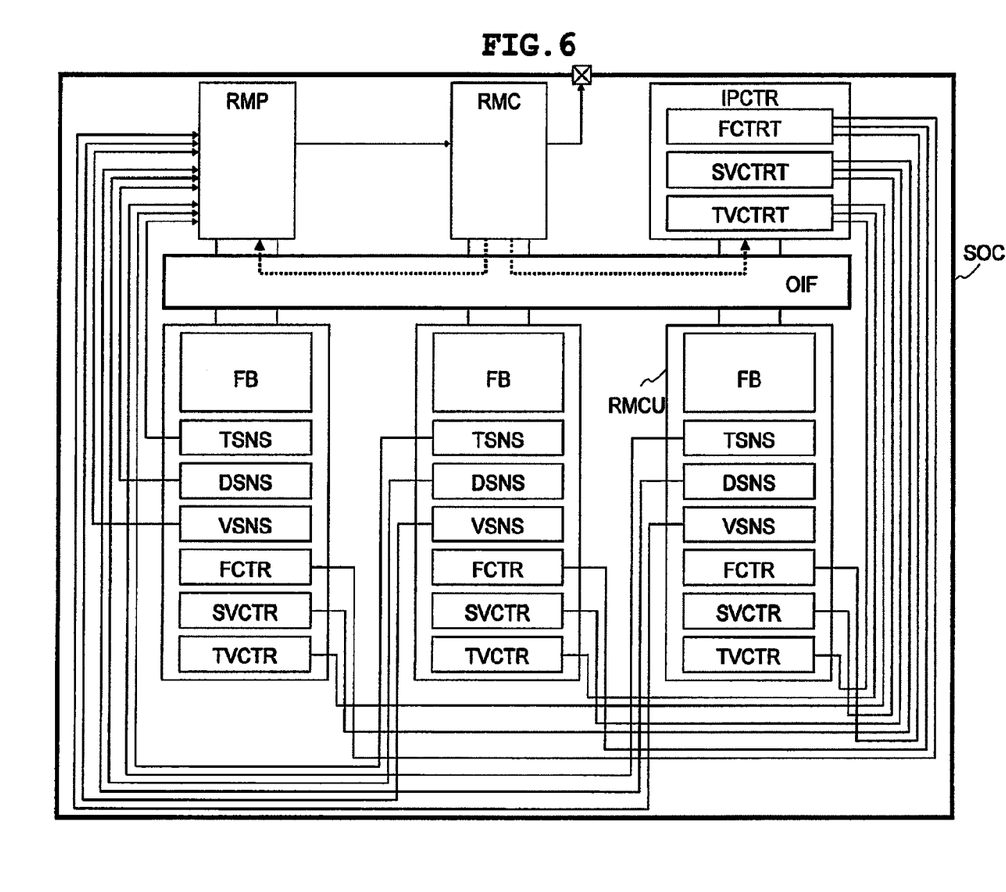
FIG. 6 is a block diagram of another example of the above system-on-chip.

FIG. 6 shows another example of the above system-on-chip SOC.

The big differences between the system-on-chip SOC shown in FIG. 6 and the system-on-chip shown in FIG. 1 are that three functional blocks RMCU's are provided and that each functional block RMCU is a block in which sensor blocks (thermal sensor TSNS, delay monitor DSNS and VSNS), frequency control unit FCTR, power voltage control unit SVCTR and body bias control unit TVCTR are added to a functional block FB to be controlled. TSNS is a thermal sensor. The delay monitor DSNS is a circuit block for monitoring whether the operation frequency of the functional block RMCU is suitably controlled or not, and a pseudo path having the same delay as the critical path is used to determine it. VSNS is a circuit block for monitoring the operation voltage of the functional block RMCU. The information of the thermal sensor TSNS, the delay monitor DSNS and VSNS are transmitted to the controller RMC through RMP. The temperature, voltage and delay have close relationship with one another. Since the controller RMC has these monitor circuit blocks, it can make overall determination and determine the operation conditions of the arithmetic blocks FB. IPCTR is a block for instructing the cut-off of operation frequency and power voltage, and the control of body bias, for the arithmetic block FB to be controlled. FCTRT in this block IPCTR is a block comprising a storage unit for specifying the operation frequency of each arithmetic block FB, and SVCTRT is a block comprising a storage unit for specifying (including cutting off) a power voltage value for each arithmetic block FB and a storage unit for specifying the body bias of each arithmetic block FB. The controller RMC uses write instructions to instruct FCTRT, SVCTRT and TVCTRT. FCTR in the functional block RMCU is a control block which operates at a frequency specified by FCTRT in IPCTR, SVCTR in the functional block RMCU is a control block for operating the power control circuit in the functional block RMCU by an instruction from SVCTRT in the block IPCTR, and TVCTR in the functional block RMCU is a block for controlling the body bias value in the functional block RMCU by an instruction from TVCTRT in IPCTR. This system-on-chip SOC has a terminal for specifying a voltage value to be supplied to the power voltage control circuit external to the system-on-chip SOC, and an output value to this terminal can be specified from RMC. The control unit of the body bias is the same as the control unit of the power voltage in this embodiment but may be different from the control unit of the power voltage as a matter of course. Although the control units are block units in the LSI in this embodiment, the LSI may be a single control unit as a whole as a matter of course.

Figure 7:
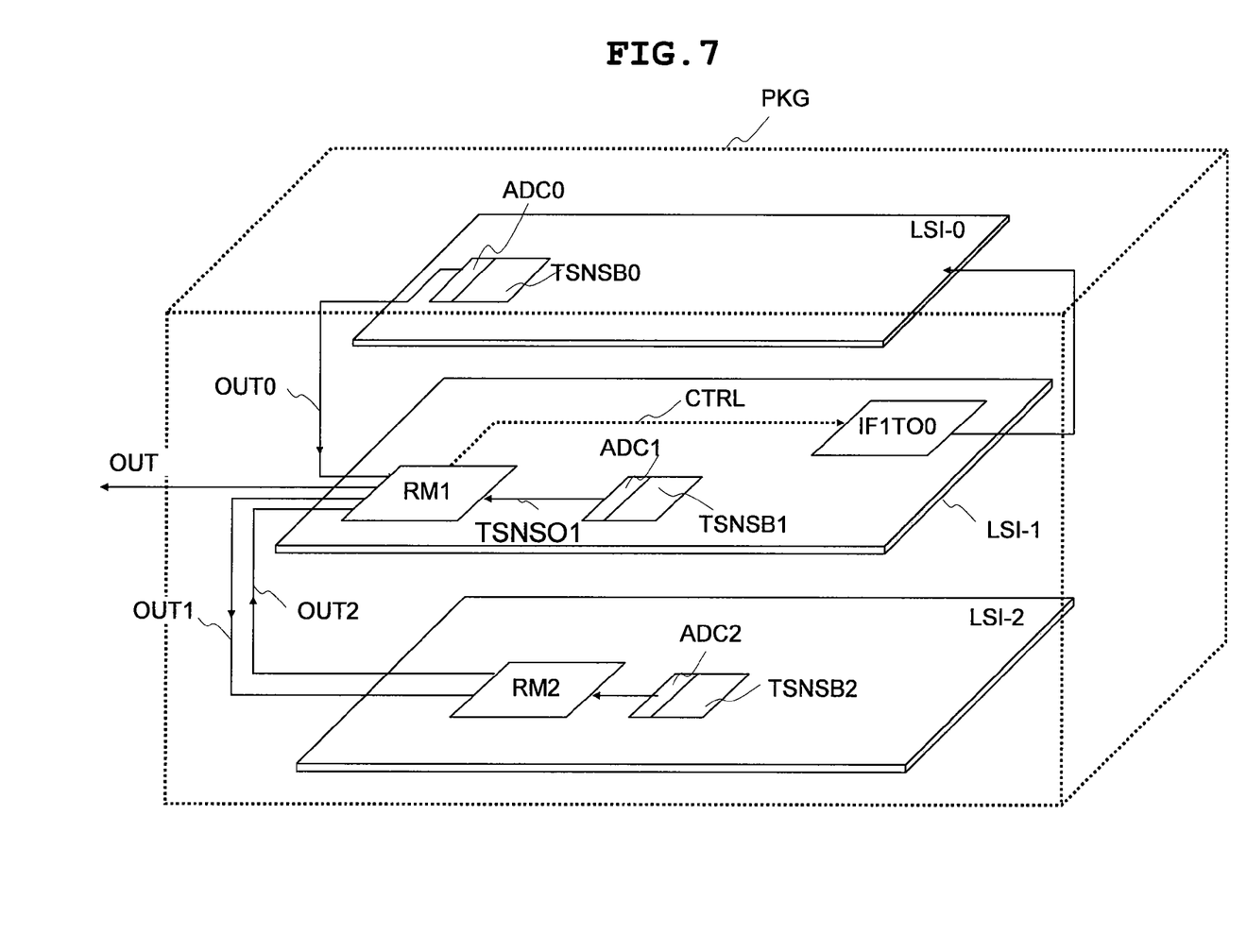
FIG. 7 is a diagram showing a system including the above system-on-chip.

When a plurality of high-performance LSI's are provided in a single package, a heat problem is extremely important. FIG. 7 shows that a plurality of semiconductor chips are sealed in one package.

LSI-0, LSI-1 and LSI-2 are stored in one package PKG. In this embodiment, LSI-1 and LSI-2 are LSI's which operate autonomously, and LSI-0 is a slave LSI which receives a request from LSI-1 and processes it. A typical example of LSI-0 is a memory.

LSI-0 comprises a thermal sensor TSNSB0, an AD conversion block ADC0 for converting an analog voltage as an output from the thermal sensor TSNSB0 into a digital signal, and an output signal OUT0 for informing other LSI's of the digital value, in addition to its own functional blocks. The operation temperature of LSI-0 can be known by other LSI's due to this mechanism.

LSI-1 includes the functional blocks shown in FIG. 1 and FIG. 6. A signal OUT0 for giving temperature information on LSI-0 and OUT2 for giving temperature information on LSI-2 are transmitted to LSI-1. LSI-1 has a thermal sensor TSNSB1 for measuring the temperature information of LSI-1 itself, an AD conversion block ADC1 for converting the output of the thermal sensor TSNSB1 into a digital signal, and a control block RM1 for controlling the temperature. RM1 in LSI-1 is a block including a controller RMC for executing the above temperature control algorithm and peripheral circuit block RMP having the function of transmitting information from the sensors to RMC. The temperature information of LSI-0, LSI-1 and LSI-2 are collected to the block RM1 by the signals OUT0 and OUT2 and the output signal TSNS01 of the thermal sensor, and the block RM1 in LSI-1 computes the operation conditions of LSI-0, LSI-1 and LSI-2 not to exceed the limit temperatures of these LSI's. RM1 in LSI-1 controls heat generated from LSI's according to the operation conditions. An instruction is given to the interface IF1TO0 for transmitting a request from LSI-1 to LSI-0 for LSI-0 which is a slave LSI of LSI-1 to limit the maximum number of requests. LSI-2 is informed of the operation conditions for suppressing the computed amount of heat to a predetermined value by means of the signal OUT1. The operation frequencies and power voltages of the functional blocks in LSI-1 are controlled to satisfy the predetermined operation conditions like the constitution shown in FIG. 1 and FIG. 6. Further, LSI-1 has an output terminal OUT for issuing a request to the outside of PKG. For example, the condition of the ambient temperature can be changed by varying the revolution of a cooling fan by means of an output signal from the output terminal OUT.

LSI-2 has an signal OUT1 as means of knowing the operation condition of LSI-2 computed by the block RM1 of LSI-1, a thermal sensor TSNSB2 for measuring the temperature information of LSI-2 itself, an AD conversion block ADC2 for converting the output of the thermal sensor TSNSB2 into a digital signal, a signal OUT2 for transmitting the temperature information of LSI-2 to the block RM1 of LSI-1, and a controller RM2 in addition to its own functional blocks. The controller RM2 controls the operation frequencies and power voltages of the functional blocks in LSI-2 in accordance with the operation conditions obtained by the signal OUT1.

Since a heat problem becomes more serious when a plurality of semiconductor chips are provided in one package, temperature information is made exchangeable among the above semiconductor chips, thereby making it possible to optimize the heat problem of the whole system.

Having described the invention made by the present inventor, it is needless to say that the invention is not limited by any of the details of description and that various changes and modifications may be made in the invention without departing from the spirit and scope thereof.

While the case where the invention made by the present inventor is applied to a system-on-chip which is the field of the invention has been described, the present invention is not limited to this and can be widely applied in various types of semiconductor integrated circuit devices.

What is claimed is:

1. A semiconductor integrated circuit device comprising:
    arithmetic blocks performing predetermined arithmetic processing;
    thermal sensors having a plurality of reference values different from one another, detecting temperature, and determining whether the detection result exceeds each of the reference values thereby to output the result; and
    a control block capable of controlling an operation of the arithmetic blocks based on the output signals of the thermal sensors,
    wherein the control block includes
        a peripheral circuit block generating an interrupt signal based on the output signals of the thermal sensors; and
        a controller returning to an operation state from a suspended state with the input interrupt signal as a trigger and can determine the operation conditions of the arithmetic blocks to ensure that the temperature conditions of the arithmetic blocks are satisfied, and
    wherein each of the thermal sensors includes
        a thermal sensor block detecting temperature; and
        a plurality of comparators comparing the temperature detection result of the temperature sensor block with a plurality of different reference voltages,
        wherein the peripheral circuit block includes an interrupt control circuit generating a plurality of interrupt signals corresponding to output signals from the comparators.

2. The semiconductor integrated circuit device according to claim 1,
    wherein the peripheral circuit block includes a filter block integrating the output signals from the comparators, and the output signal of the filter block is transmitted to the interrupt control circuit.

3. The semiconductor integrated circuit device according to claim 1 further comprising:
    an external terminal capable of outputting the temperature detection result of the thermal sensor block to the outside of the semiconductor integrated circuit device.

4. The semiconductor integrated circuit device according to claim 1 further comprising:
    delay monitors capable of monitoring the amount of delay of a critical path in the arithmetic blocks,
    wherein the interrupt control circuit generates interrupt signals corresponding to the output signals of the delay monitors separately from the interrupt signals corresponding to the output signals from the comparators and outputs them to the controller.

5. The semiconductor integrated circuit device according to claim 1, wherein the controller controls the operations of the arithmetic blocks to exhibit the maximum performance while the temperature conditions of the arithmetic blocks are satisfied.

6. The semiconductor integrated circuit device according to claim 5, wherein the controller performs a first processing operation computing the component of heat derived from ambient temperature and leakage current, and a second processing operation computing the permissible maximum operation power using the computing result obtained in the first processing operation, and wherein power permissible in the arithmetic blocks is determined based on the computing result of the second processing operation.

7. A semiconductor integrated circuit device comprising:

arithmetic blocks performing predetermined arithmetic processing;

thermal sensors having a plurality of reference values different from one another, and detecting temperature, and determining whether the detection result exceeds each of the reference values thereby to output the result;

delay monitors capable of monitoring the amount of delay of a critical path in the arithmetic blocks;

an operation voltage monitor capable of monitoring the operation voltages of the arithmetic blocks; and a control block capable of controlling an operation of the arithmetic blocks based on the output signals of the thermal sensors, the monitoring results of the delay monitors and the monitoring result of the operation voltage monitor, wherein the control block includes:

a peripheral circuit block generating an interrupt signal based on the output signals of the thermal sensors, the monitoring results of the delay monitors and the monitoring result of the operation voltage monitor;

a controller returning to an operation state from a suspended state with the input interrupt signal as a trigger and determining the operation conditions of the arithmetic blocks to ensure that the temperature conditions of the arithmetic blocks are satisfied; and an operation condition control circuit capable of instructing the operation frequencies of the arithmetic blocks, the cutting off of the power voltages of the arithmetic blocks and the control of body bias based on the operation conditions determined by the controller.

* * * * *